United States Patent [19]
Dembinski

[11] Patent Number: 4,733,190
[45] Date of Patent: Mar. 22, 1988

[54] NMR LOCAL COIL WITH ADJUSTABLE SPACING

[75] Inventor: Gerald T. Dembinski, New Berlin, Wis.

[73] Assignee: Medical Advances, Inc., Wauwatosa, Wis.

[21] Appl. No.: 26,305

[22] Filed: Mar. 16, 1987

[51] Int. Cl.$^4$ ........................................... G01K 33/20
[52] U.S. Cl. ..................................... 324/318; 333/219; 336/65; 128/653; 324/222
[58] Field of Search ............... 324/307, 316, 318, 322, 324/300, 313; 128/653; 333/219, 235, 230; 336/115, 121, 129, 142, 65

[56] References Cited
U.S. PATENT DOCUMENTS 4,435,680  3/1984  Froncisz et al. ................... 324/318
4,587,493  5/1986  Sepponen ........................... 324/318
4,698,595  10/1987  Röschmann ........................ 324/313

FOREIGN PATENT DOCUMENTS 0191180  8/1986  European Pat. Off. ............ 128/653

Primary Examiner—Stewart J. Levy
Assistant Examiner—Kevin D. O'Shea
Attorney, Agent, or Firm—Quarles & Brady

[57] ABSTRACT

A local coil assembly for use in NMR imaging includes a base which supports a pair of spaced local coil modules. The size and separation of the local coil modules can be changed without affecting the resonant frequency of the assembly. Each local coil module includes a pair of loop-gap resonators, and the base provides the electrical interconnection of the loop-gap resonators in each module.

7 Claims, 5 Drawing Figures

NMR LOCAL COIL WITH ADJUSTABLE SPACING

BACKGROUND OF THE INVENTION

The field of the invention is nuclear magnetic resonance imaging methods and systems. More particularly, the invention relates to a local coil which may be used to provide localized reception of the NMR signals produced in a whole body NMR scanner system or the like.

Any nucleus which possesses a magnetic moment attempts to align itself with the direction of the magnetic field in which it is located. In doing so, however, the nucleus precesses around this direction at a characteristic angular frequency (Larmor frequency) which is dependent on the strength of the magnetic field and on the properties of the specific nuclear species (the magnetogyric constant $\gamma$ of the nucleus). Nuclei which exhibit this phenomena are referred to herein as "spins".

When a substance such as human tissue is subjected to a uniform magnetic field (polarizing field $B_z$), the individual magnetic moments of the spins in the tissue attempt to align with this polarizing field, but precess about it in random order at their characteristic Larmor frequency. A net magnetic moment $M_z$ is produced in the direction of the polarizing field, but the randomly oriented magnetic components in the perpendicular, or transverse, plane (x-y plane) cancel one another. If, however, the substance, or tissue, is subjected to a magnetic field (excitation field $B_1$) which is in the x-y plane and which is near the Larmor frequency, the net aligned moment, $M_z$, may be rotated, or "tipped", into the x-y plane to produce a net transverse magnetic moment $M_1$, which is rotating, or spinning, in the x-y plane at the Larmor frequency. The degree to which the net magnetic moment $M_z$ is tipped, and hence, the magnitude of the net transverse magnetic moment $M_1$ depends primarily on the length of time and magnitude of the applied excitation field $B_1$.

The practical value of this phenomenon resides in the signal which is emitted by the excited spins after the excitation signal $B_1$ is terminated. In simple systems the excited nuclei induce an oscillating sine wave signal in a receiving coil. The frequency of this signal is the Larmor frequency, and its initial amplitude, $A_0$, is determined by the magnitude of the transverse magnetic moment $M_1$. The amplitude, A, of the emission signal decays in an exponential fashion with time, t:

$$A = A_0 e^{t/T^*_2}$$

The decay constant $1^*_2$ depends on the homogeneity of the magnetic field and on $T_2$, which is referred to as the "spin-spin relaxation" constant, or the "transverse relaxation" constant. The $T_2$ constant is inversely proportional to the exponential rate at which the aligned precession of the spins would dephase after removal of the excitation signal $B_1$ in a perfectly homogeneous field.

Another important factor which contributes to the amplitude A of the NMR signal is referred to as the spin-lattice relaxation process which is characterized by the time constant $T_1$. This is also called the longitudinal relaxation process as it describes the recovery of the net magnetic moment M to its equilibrium value along the axis of magnetic polarization (z). The $T_1$ time constant is longer than $T_2$, much longer in most substances of medical interest.

NMR has rapidly developed into an imaging modality which is utilized to obtain tomographic, projection and volumetric images of anatomical features of live human subjects. Such images depict the nuclear-spin distribution (typically protons associated with water and fat), modified by specific NMR properties of tissues, such as spin-lattice ($T_1$), and spin-spin ($T_2$) relaxation time constants. They are of medical diagnostic value because they depict anatomy and allow tissue characterization.

The NMR scanners which implement these NMR techniques are constructed in a variety of sizes. Small, specially designed machines, are employed to examine laboratory animals or to provide images of specific parts of the human body. On the other hand, "whole body" NMR scanners are sufficiently large to receive an entire human body and produce an image of any portion thereof.

There are a number of techniques employed to produce the excitation field ($B_2$) and receive the NMR signal. The simplest and most commonly used structure is a single coil and associated tuning capacitor which serves to both produce the excitation signal and receive the resulting NMR signal. This resonant circuit is electronically switched between the excitation circuitry and the receiver circuitry during each measurement cycle. Such structures are quite commonly employed in both small NMR scanners and whole body NMR scanners.

It is also quite common to employ separate excitation coils and receiver coils. While such NMR scanners require additional hardware, the complexities of electronic switching associated with the use of a single coil are eliminated and specially designed coils may be employed for the separate excitation and receive functions. For example, in whole body NMR scanners it is desirable to produce a circularly polarized excitation field ($B_1$) by using two pairs of coils which are orthogonally oriented, and which are driven with separate excitation signals that are phase shifted 90° with respect to each other. Such an excitation field is not possible with a single coil.

It is very difficult to construct a large coil which has both a uniform and high sensitivity to the NMR signal produced in a whole body NMR scanner. As a result, another commonly used technique is to employ "local" coils to either generate the excitation signal ($B_1$), receive the resulting NMR signal, or both generate and receive. Such local coils are relatively small and are constructed to produce the desired field or receive the NMR signal from a localized portion of the patient. For example, different local coils may be employed for imaging the head and neck, legs and arms, or various internal organs. When used as a receiver, the local coil should be designed to provide a relatively uniform sensitivity to the NMR signals produced by the spin throughout the region of interest.

Recently, a novel resonator structure, referred to in the art as a "loop-gap" resonator, has been applied as a local NMR coil. As indicated in U.S. Pat. Nos. 4,435,680; 4,446,429; 4,480,239 and 4,504,577, the loop-gap resonator may take a wide variety of shapes. In all cases, however, a lumped circuit resonator is formed in which a conductive loop is the inductive element and one or more gaps are formed in this loop to form a capacitive element. While the loop-gap resonator has many desirable characteristic normally associated with lumped circuit resonators, it also has some characteristics normally associated with cavity resonators. Most notable of these is the much higher quality factor, or "Q", of the loop-gap resonator over the traditional lumped circuit resonators. When applied to NMR scanners, this higher Q translates into higher resolution images.

Local receiver coils may be positioned in any orientation with respect to the generated excitation field (B₁) in order to receive the desired NMR signals. To prevent damage to the local coil (or receiver) and to prevent distortion of the excitation field (B₁), the local coil is designed to be intrinsically isolated from the uniform excitation field. This is accomplished by employing pairs of loop-gap resonators and connecting them together in such manner that they have little sensitivity to a uniform excitation field. Such local coils are described in co-pending U.S. patent application Ser. No. 731,923, filed on May 8, 1985, and entitled "Loop-gap Resonator for Localized NMR Imaging."

While it is possible to design separate local coils for each possible imaging application, it is far more practical to provide a single structure which can be physically adjusted to meet a wide variety of needs. Unfortunately, such physical adjustments affect the electrical characteristics of the local coil, requiring that it be tuned after each adjustment. This requires time which is very expensive when it causes a whole body NMR scanner to remain idle, and it requires a relatively high level of skill on the part of the medical technician operating the machine.

SUMMARY OF THE INVENTION

The present invention relates to a local coil assembly for use in NMR imaging and, particularly, to a local coil assembly which may be physically adjusted to meet a wide variety of imaging needs and which does not require electrical adjustment after each such physical change. The present invention includes a base having a first local coil module mounted thereto and extending upward therefrom, a plurality of sockets disposed in the base at different distances from the first local coil module, a second local coil module having a connector which may be received in any of the plurality of sockets to connect the second local coil module to the base at any of the different distances from the first local coil module, and a set of reactive components, each associated with one of the respective sockets and each electrically connected to the second local coil module when it is inserted into the associated socket to tune the second local coil module for the particular physical orientation.

A general object of the invention is to provide a local NMR coil which may be easily adjusted to meet a variety of needs. The physical adjustment is made by plugging the second local coil module into the appropriate socket. That socket connects to a reactive component which automatically adjusts the electrical characteristics of the second local coil so that it is properly tuned for the selected physical spacing. Thus, the local coil may be easily adjusted to image anatomical structures ranging in size from a hand or wrist to the thigh or head.

Another object of the invention is to enable different sized local coil modules to be used. This is accomplished by providing a socket in the base for the first local coil module as well as the second module, which enables them both to be easily replaced with other similar but differently sized modules. It has been discovered that this can also be accomplished without the need for separate electrical adjustment. Thus, the size of the region of interest to be imaged can be easily adjusted by spacing the local coil modules apart at one of the selectable distances, and by choosing the proper size of each local coil module.

The foregoing and other objects and advantages of the invention will appear from the following description. In the description, reference is made to the accompanying drawings which form a part hereof, and in which there is shown by way of illustration a preferred embodiment of the invention. Such embodiment does not necessarily represent the full scope of the invention, however, and reference is made therefore to the claims herein for interpreting the scope of the invention.

DESCRIPTION OF THE PREFERRED EMBODIMENT

Figure 1:
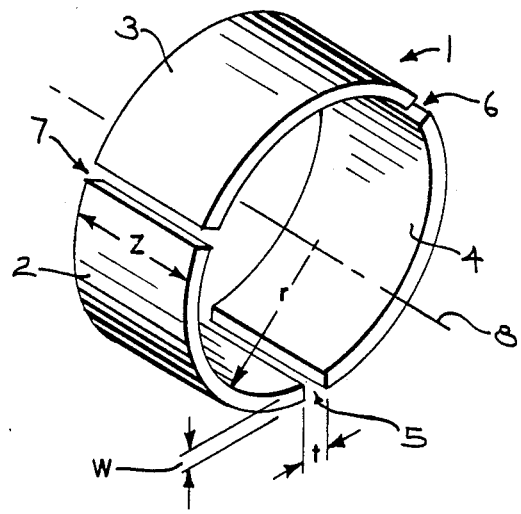
FIG. 1 is a perspective view of a loop-gap resonator which is employed in the present invention.

Referring particularly to FIG. 1, the loop-gap resonator 1 which is employed in the present invention is a lumped circuit resonator which resonates at a radio frequency determined by its geometry. The lumped circuit resonator 1 has dimensions which are much less than the wavelength of the radio frequency signal at which it resonates. The capacitive and inductive elements are identifiable and the electromagnetic field oscillates between a magnetic field generated by the inductive element and an electric field generated by the capacitive element.

The inductive element in the resonator 1 is the loop, or ring, formed by three metallic pieces 2, 3 and 4, and the capacitive element is the longitudinal gaps 5, 6 and 7 formed at the juncture of the three pieces 2, 3 and 4. The magnetic field produced by the resonator 1 is concentrated along a central axis 8, and the electric field is concentrated in the gaps 5, 6 and 7. The magnetic flux flows through the opening defined by the loop and curves radially outward at each of its ends and along the outside of the loop to form a closed flux path. The resonant frequency of the resonator 1 is determined primarily by its geometry, and it can be constructed to operate over a wide range of frequencies of interest. Where the spacing (t) in the gaps 5, 6 and 7 is much smaller than their width (w), the resonant frequency of a loop-gap resonator is as follows:

$$F = \frac{1}{2\pi}\left(\frac{1}{LC}\right)^{\frac{1}{2}}$$

where: $L = \frac{\mu \pi r^2}{Z}$ $$\frac{1}{C} = \sum_{m=1}^{n} \frac{t_m}{\epsilon W_m Z}$$

$\epsilon$ = the dielectric constant of the material in the gaps;
$\mu$ = the permeability of free space;

n = the number of gaps, each having dimensions $t_m$ and $W_m$; and z = the length of the resonator 1 in the direction of the central axis 8.

There are a number of characteristics of the loop-gap resonator which are important when applying them to practical use. First, the length (Z) has virtually no effect on the resonant frequency. Second, one or more gaps may be employed and these need not be of equal dimensions or provide equal capacitance. The loop need not be circular, although there are often advantages to a circular construction. And finally, energy may be applied or removed from the loop-gap resonator in either of two ways. Energy may be inductively coupled to or from the resonator by a conductive loop which encircles magnetic flux flowing through the loops and which connects to the end of a transmission line. Alternatively, energy can be capacitively coupled to or from the resonator by connecting the transmission line to the plates of one of the resonator's capacitive elements through an impedance matching network.

Figure 2:
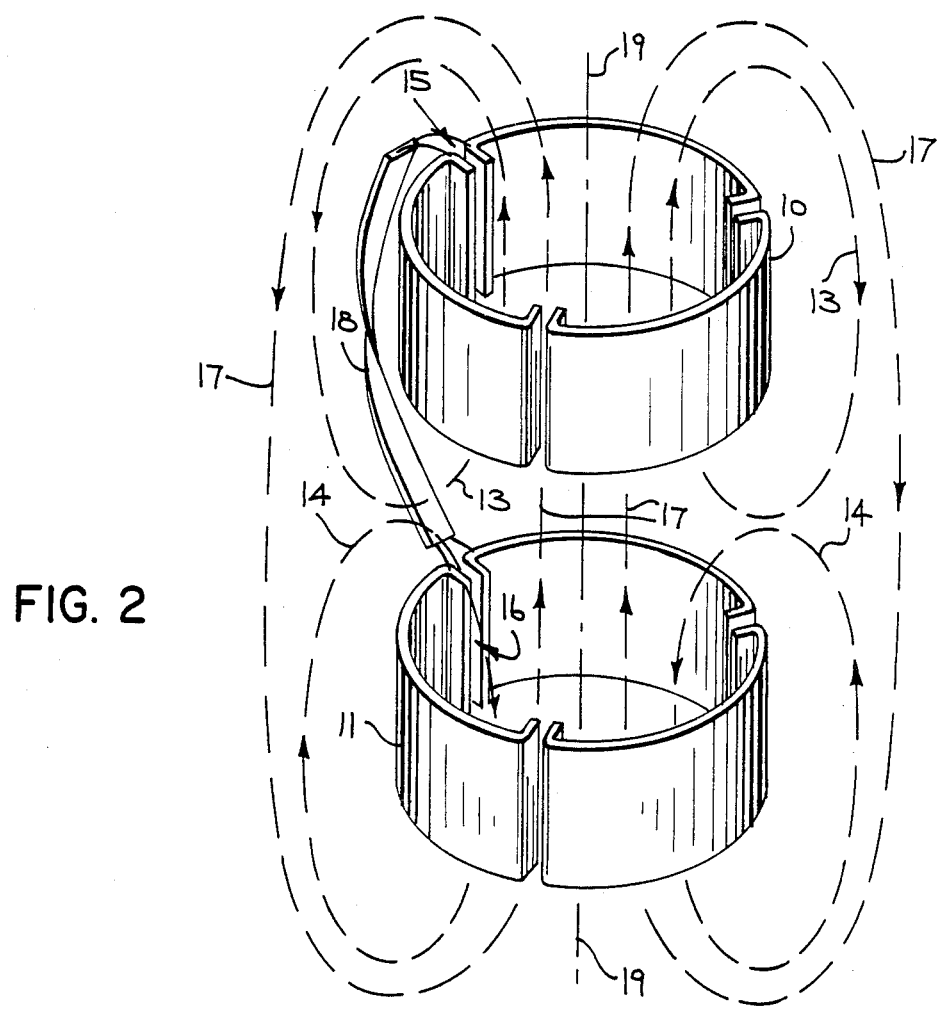
FIG. 2 is a perspective view of a pair of loop-gap resonators which are employed in the present invention.

Referring to FIG. 2, each local coil module employed in the present invention employs two loop-gap resonators 10 and 11 which are spaced from one another and aligned along a common axis 19. When placed next to each other in this manner, the loop-gap resonators 10 and 11 will resonate in two modes. The first mode, referred to herein as the "unlinked" mode, is indicated by the dashed lines 12 and 14 which represent the paths of the magnetic flux flowing through each loop-gap resonator 10 and 11 in the opposite directions. The second resonant mode, referred to herein as the "linked" mode, is indicated by the dashed lines 17 which represent the paths of the magnetic flux flowing through each resonator 10 and 11 in the same direction. When the loop-gap resonators 10 and 11 are closely spaced, the frequency of each of these resonant modes is substantially different due to the mutual inductance.

To provide a local NMR probe which is intrinsically isolated from the excitation field $B_1$, the linked mode is suppressed. This is accomplished by providing electrical cross-connections between the "plates" of the respective gaps 15 and 16 in the resonators 10 and 11. By forcing the electric potential to zero between opposite plates in the respective gaps 15 and 16, the linked resonant mode is suppressed and the field indicated by dashed line 17 is not produced. As a result, the coaxially aligned loop-gap resonators 10 and 11 are sensitive to locally produced NMR signals but are insensitive and substantially isolated from a uniform excitation field ($B_1$). Such a coaxial pair of loop-gap resonators is employed in each of the local coil modules of the present invention, although the particular size and number of gaps in each loop 10 and 11 may be different from that shown.

Figure 3:
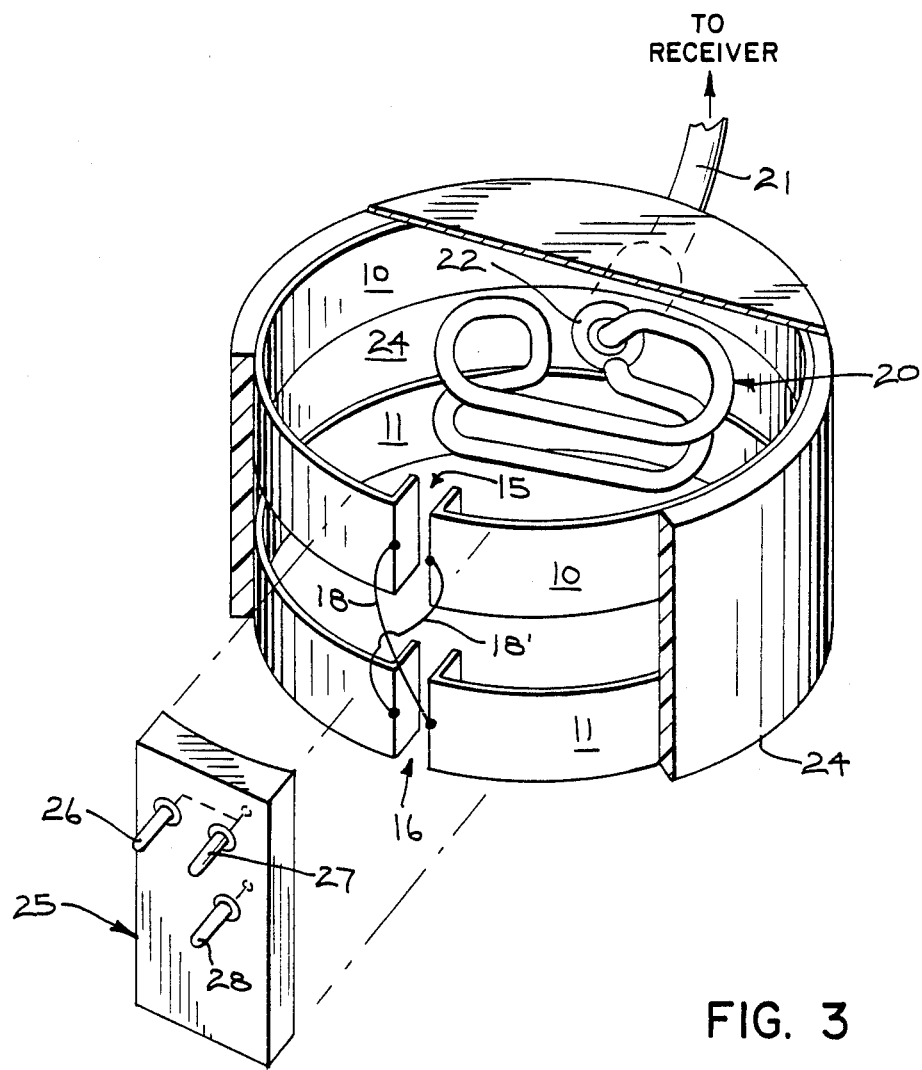
FIG. 3 is a perspective view with parts cut away and exploded of a local coil module which is employed in the present invention.

One such local coil module is shown in more detail in FIG. 3. The module includes a circular cylindrical insulating base 24 formed from a section of polyvinyl chloride tubing of the desired diameter (3 inch, 4 inch, 5 inch or 6 inch, for example). The loops 10 and 11 are formed of sheet copper which is bonded to the inside surface of the base 24. The gaps 15 and 16 are formed by bending the end portions of the sheet copper inward and separating them with an insulating material (not shown). These inward extending tabs are trimmed in size to roughly tune the axial pair 10 and 11 to the desired resonant frequency. Although only one gap is shown in each loop 10 and 11, it can be appreciated by those skilled in the art that additional gaps may be formed to distribute the capacitance and thereby reduce the detuning effect when the local coil module is placed adjacent the subject to be imaged. Anywhere from placed adjacent the subject to be imaged.

To extract an NMR signal from the local coil module, a coupling loop 20 is employed. The coupling loop 20 is connected to a transmission line 21 which leads to the receiver of the NMR scanner system. The transmission line 21 is terminated at a head connector 22 which mounts between the loop-gap resonators 10 and 11 and the ends of the coupling loop 20 connect to respective terminals on the head connector 22. The coupling loop 20 extends inward from the plane of the loop-gap resonators 10 and 11 and wraps around as shown. For an alternative way to construct the coupling loop 20, reference is made to co-pending U.S. patent application Ser. No. 026,294 which is filed on even date herewith and which is entitled "NMR Local Coil With Foil Coupling Loop."

Referring still to FIG. 3, the local coil module includes a connector 25 which is bonded to the outside of the base 24 directly over the cross-connected gaps in the loops 10 and 11. The connector 25 includes three conductive pins 26–28 which extend outward. The pins 26 and 27 are connected together electrically and are, in turn, connected to the cross-connect wire 18. The pin 28 electrically connects to the other cross-connect wire 18'.

The local coil modules are used in pairs. They are spaced apart from each other and electrically interconnected to provide a relatively uniform sensitivity to NMR signals emanated from the region between them. They are relatively insensitive to the excitation field ($B_1$). As taught in the above-cited co-pending U.S. patent application Ser. No. 731,923, the frequency at which the two local coil modules resonate as a pair is determined in part by their spacing. That is, if everything else remains constant, the resonate frequency of the pair increases as they are moved further apart and decreases as they are moved closer together.

Figure 4:
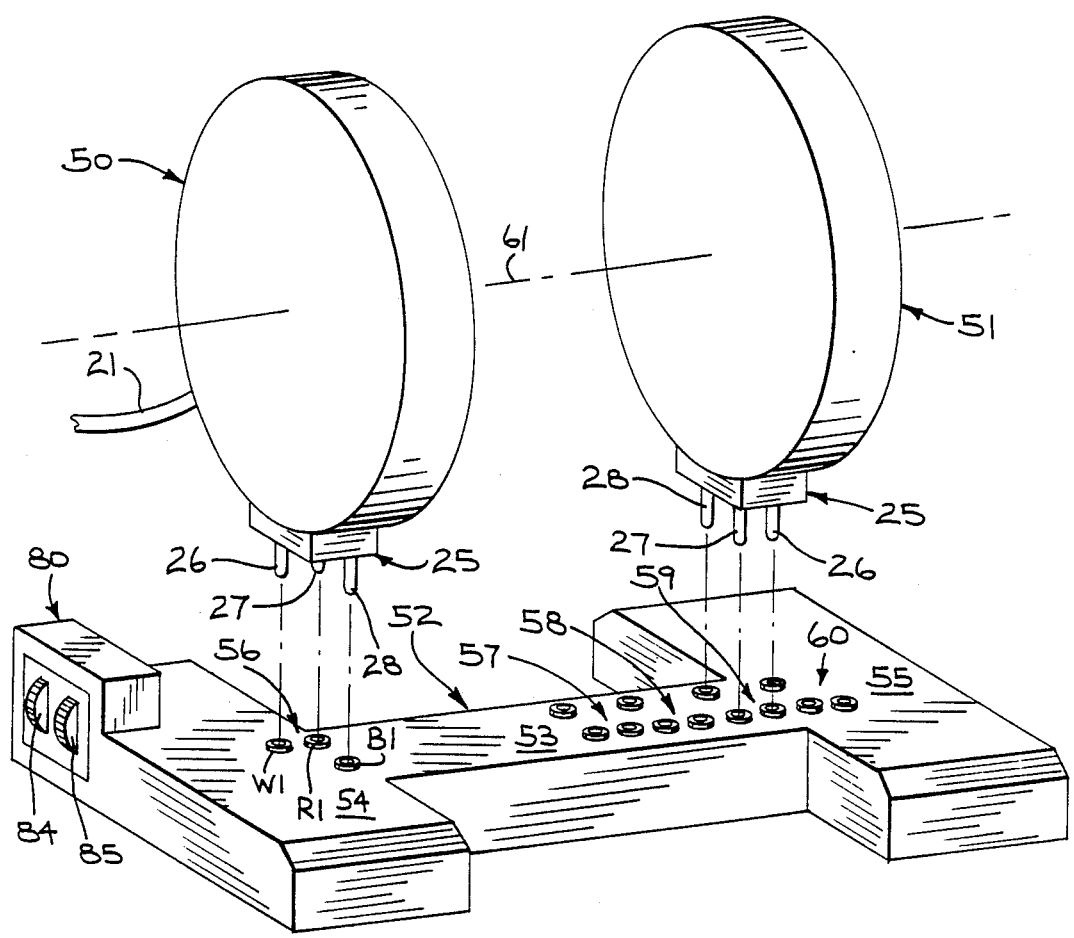
FIG. 4 is a perspective view of the local coil assembly which incorporates the present invention.

Referring particularly to FIG. 4, the local coil of the present invention includes a first local coil module 50 and a second local coil module 51 which are mounted to a base 52. The base 52 is formed from an insulating material such as clear acrylic and it includes a mid-section 53 and a pair of laterally extending arms 54 and 55. A socket 56 is formed at one end of the base 52 by a set of three receptacles B1, R1 and W1, which are aligned to receive the pins 26–28 on the first local coil module 50. As will be explained in more detail below, the receptacles B1, R1, and W1 provide electrical connections as well as mechanical support for the first local coil module 50.

Four additional sockets 57–60 are formed at the other end of the base 52 by identical sets of receptacles. The sockets 57–60 are spaced at progressively increasing distances from the socket 56 such that the second local coil module 51 may be plugged into any one of them at progressively increasing distances from the first local coil module 50. As a result, the second local coil module 51 can be mounted and electrically connected to the base 52 at distances of 3.75, 4.5, 5.25 or 6.0 inches from the first local coil module 50 as measured along a common central axis 61. This enables the local coil assembly to be used in a wide variety of medical imaging applications, such as hands, wrists, elbows, feet and knees.

Figure 5:
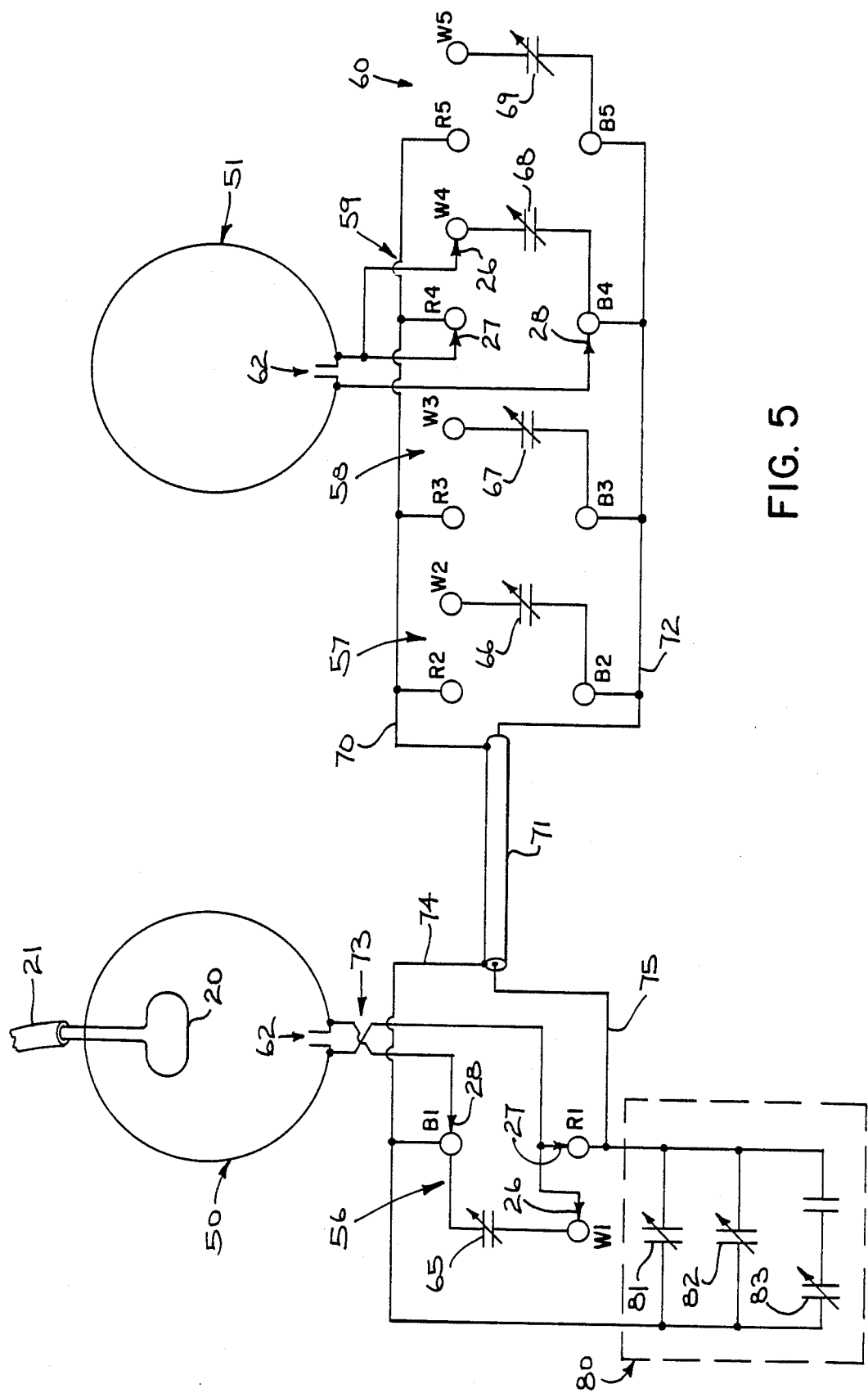
FIG. 5 is an electrical schematic diagram of the local coil assembly of FIG. 4.

The electrical interconnection of the sockets 57-60 is shown schematically in FIG. 5. In this schematic representation, the cross-connected gaps 15 and 16 in each module 50 and 51 are shown as a single gap 62 and will be referred to hereinafter as a single capacitive element. Each socket 56-60 includes a reactive component in the form of a variable capacitor 65-69 which connects between the receptacles W and B. As a result, each capacitor 65-69 is connected across the gap 62 of the local coil module 50 or 51 which is plugged into the socket. The capacitors 65-69 thus add to the capacitance of the local coil module 50 or 51 and may be adjusted in value to alter the resonant frequency. When a module 50 or 51 is not plugged into a socket 56-60, the capacitor 65-69 for that socket is not connected and has no effect on the frequency of the assembly.

In order for the modules 50 and 51 to operate as an axial pair and to thereby provide the desired uniform region of sensitivity between them, electrical connections must be made between their respective gaps 62. These connections are provided by a bus wire 70 which connects the receptacles R2-R5 to one conductor of a coaxial cable 71, and a bus wire 72 which connects the receptacles B2-B5 to the other conductor in the cable 71. The other ends of the coaxial cable 71 connect to the respective receptacles B1 and R1 through bus wires 74 and 75 to complete the interconnection of the gaps 62. It should be noted that while these electrical connections appear to be crossed, the physical orientation of the first module 50 is reversed with respect to the second module 51 such that corresponding sides of the gaps 62 are in fact connected together. This physical reversal is represented schematically in FIG. 5 by the crossed leads at 73.

Referring particularly to FIGS. 4 and 5, to provide a course and fine adjustment to the resonant frequency of the local coil assembly, a tuning capacitor module 80 is connected across the bus wires 74 and 75. The tuning capacitor module 80 is mounted to one end of the arm 54. It includes a coarse adjustment capacitor 81 which is inaccessible to the user, and a medium adjustment capacitor 82 and fine adjustment capacitor 83 which are accessible to the user through dials 84 and 85.

The local coil assembly may be tuned to operate without further adjustment when the modules 50 and 51 are positioned at the four different spacings and even when different sized modules 50 and 51 are used. To accomplish this, each local coil module 50 and 51 is designed to resonate at 1.5 MHz above the desired center frequency. A pair of modules 50 and 51 are then inserted into the respective sockets 56 and 57 and the capacitors 65, 66 and 81 are adjusted to the desired center line resonant frequency. The local coil module 51 is then moved to each of the remaining sockets 58-60 and the respective capacitors 67-69 are adjusted such that center frequency resonance is achieved for each position of the module 51. Any modules 50 and 51 which are properly tuned to resonate at 1.5 MHz above the center frequency can then be used in the assembly at any of the four spacings. The fine adjustments in frequency provided by the tuning capacitor module 80 are available to the medical technician to account for small frequency changes due to the variations in coupling with the subject being imaged. These variations can be minimized by increasing the number of gaps in the loop-gap resonators used in the modules 50 and 51, but minor adjustment is still sometimes required.

I claim:

1. A local coil assembly for use in NMR imaging which comprises:
   a base;
   a first local coil module mounted to the base and extending upward therefrom;
   a plurality of sockets disposed in the base, each at a different distance from the first local coil module;
   a second local coil module having a connector thereon which mates with each of the plurality of sockets to enable the second local coil module to be connected to the base at any one of the sockets; and
   a set of reactive components, each reactive component being connected to a respective one of the sockets such that when the second local coil module is inserted in a socket, the reactive component thereat electrically connects to a resonator in the second local coil module and alters the resonant frequency thereof;
   wherein the values of the respective reactive components are selected such that the second local coil module may be connected to any of said plurality of sockets without any substantial change in the resonant frequency of the assembly.

2. The local coil assembly as recited in claim 1 wherein the resonator in the second local coil module is a loop-gap resonator and there is a similar resonator in the first local coil module.

3. The local coil assembly as recited in claim 2 in which connection means are disposed in the base and electrically connect the loop-gap resonator in the first local coil module with the loop-gap resonator in the second local coil module when the second local coil module is connected to any one of said plurality of sockets.

4. The local coil assembly as recited in claim 2 in which said reactive components are capacitors.

5. The local coil assembly as recited in claim 1 in which the first local coil module is removably mounted to the base such that it can be easily replaced with other similar local coil modules.

6. The local coil assembly as recited in claim 1 in which both the first and second local coil modules each include a pair of loop-gap resonators.

7. The local coil assembly as recited in claim 6 in which connection means are disposed in the base and electrically connect the loop-gap resonators in the first local coil module with the loop-gap resonators in the second local coil module when the second local coil module is connected to any one of said plurality of sockets.

* * * * *